United States Patent
Abe et al.

(10) Patent No.: US 7,087,562 B2
(45) Date of Patent: Aug. 8, 2006

(54) POST-CMP WASHING LIQUID COMPOSITION

(75) Inventors: Yumiko Abe, Soka (JP); Takuo Oowada, Soka (JP); Norio Ishikawa, Kasukabe (JP); Hidemitsu Aoki, Kanagawa (JP); Hiroaki Tomimori, Kanagawa (JP)

(73) Assignees: Kanto Kagaku Kabushiki Kaisha, Kanagawa (JP); NEC Electronics Corporation, Kanagawa (JP)

( * ) Notice: Subject to any disclaimer, the term of this patent is extended or adjusted under 35 U.S.C. 154(b) by 178 days.

(21) Appl. No.: 10/435,165

(22) Filed: May 9, 2003

(65) Prior Publication Data

US 2003/0216270 A1    Nov. 20, 2003

(30) Foreign Application Priority Data

May 16, 2002  (JP)  .............................. 2002/141003

(51) Int. Cl.
*C11D 3/22*  (2006.01)

(52) U.S. Cl. ...................................... 510/175; 438/692
(58) Field of Classification Search ................ 438/692; 510/254, 175, 504; 134/3, 40, 41
See application file for complete search history.

(56) References Cited

U.S. PATENT DOCUMENTS

| | | | | |
|---|---|---|---|---|
| 4,140,649 A | * | 2/1979 | Bossert et al. | 426/286 |
| 4,199,469 A | * | 4/1980 | Walzer | 510/234 |
| 5,981,454 A | | 11/1999 | Small | 510/175 |
| 6,080,709 A | | 6/2000 | Ishikawa et al. | 510/175 |
| 6,143,705 A | | 11/2000 | Kakizawa et al. | 510/175 |
| 6,156,661 A | * | 12/2000 | Small | 438/692 |
| 6,326,305 B1 | * | 12/2001 | Avanzino et al. | 438/687 |
| 6,410,494 B1 | | 6/2002 | Kakizawa et al. | 510/175 |
| 6,546,939 B1 | * | 4/2003 | Small | 134/1.3 |
| 2001/0004633 A1 | | 6/2001 | Naghshineh et al. | 510/175 |

FOREIGN PATENT DOCUMENTS

| | | |
|---|---|---|
| JP | 10-72594 | 3/1998 |
| JP | 11-131093 | 5/1999 |
| JP | 20010007071 | 12/2001 |
| WO | WO 03/006205 A2 | 1/2003 |

\* cited by examiner

*Primary Examiner*—Gregory Webb
(74) *Attorney, Agent, or Firm*—Licata & Tyrrell P.C.

(57) ABSTRACT

A post-CMP washing liquid composition is provided which includes one type or two or more types of aliphatic polycarboxylic acids and one type or two or more types selected from the group consisting of glyoxylic acid, ascorbic acid, glucose, fructose, lactose, and mannose, and which has a pH of less than 3.0. This washing liquid has excellent performance in removing micro particles and metal impurities adhering to the surface of a semiconductor substrate after CMP and does not corrode a metal wiring material.

5 Claims, 1 Drawing Sheet

POST-CMP WASHING LIQUID COMPOSITION

BACKGROUND OF THE INVENTION

1. Technical Field to Which the Invention Pertains

The present invention relates to a washing liquid and, in particular, it relates to a washing liquid for a semiconductor substrate surface on which a metal wiring material (in particular, Cu) is exposed.

Furthermore, the present invention relates to a washing liquid used in the removal of micro particles and metal impurities adhering to the surface of a semiconductor substrate after chemical-mechanical polishing (hereinafter called CMP), particularly in a semiconductor production process.

2. Prior Art

Accompanying the increasing integration of ICs, there is a demand for strict contamination control since trace amounts of particles and metal impurities greatly influence the performance and yield of a device. That is, strict control of particles and metal impurities adhering to the surface of a substrate is required, and various types of washing liquids are therefore used in each of the semiconductor production processes.

With regard to washing liquids generally used for semiconductor substrates, there are sulfuric acid-hydrogen peroxide, ammonia-hydrogen peroxide-water (SC-1), hydrochloric acid-hydrogen peroxide-water (SC-2), dilute hydrofluoric acid, etc., and the washing liquids are used singly or in combination according to the intended purpose. In recent years, the CMP technique has been introduced into semiconductor production processes such as planarization of an insulating film, planarization of a via-hole, and damascene wiring. In general, CMP is a technique in which a film is planarized by pressing a wafer against a cloth called a buff and rotating it while supplying a slurry, which is a mixture of abrasive particles and a chemical agent, so that an interlayer insulating film or a metal material is polished by a combination of chemical and physical actions. Because of this, the CMP-treated substrate is contaminated with particles and metal impurities including alumina particles and silica particles, which are used in the abrasive particles in large amounts. It is therefore necessary to employ cleaning to completely remove these contaminants prior to the process that follows. As a post-CMP washing liquid, an aqueous solution of an alkali such as ammonia is conventionally used for removing particles. For removing metal contaminants, techniques using an aqueous solution of an organic acid and a complexing agent have been proposed in JP, A, 10-72594 and JP, A, 11-131093. As a technique for simultaneously removing metal contaminants and particulate contaminants, an aqueous washing solution in which an organic acid and a surfactant are combined has been proposed in JP, A, 2001-7071.

When the use of CMP was limited to the planarization of interlayer insulating films and via-holes, since a material having poor chemical resistance was not exposed on the surface of a substrate, washing with an aqueous solution of ammonium fluoride or the above-mentioned aqueous solution of an organic acid could be employed. However, the damascene wiring technique has been introduced as a technique for forming Cu wiring necessary for increasing the response speed of semiconductor devices, and at the same time there have been attempts to use, as the interlayer insulating film, a low permittivity organic film such as an aromatic aryl polymer, a siloxane film such as MSQ (Methyl Silsesquioxane) or HSQ (Hydrogen Silsesquioxane), a porous silica film, etc. Since these materials do not have sufficient chemical strength, use of the above-mentioned alkaline substance or fluoride as a washing liquid is limited.

On the other hand, it can be expected that corrosion of a low-permittivity insulating film or Cu by the above-mentioned composition employing an organic acid will be low and this composition is most preferable. However, there are new problems in the process for forming Cu wiring. One thereof is that even the use of an organic acid causes etching of the surface of copper to a slight degree. Another thereof is that micro corrosion defects of copper are observed during the damascene process for embedding copper wiring. In this case, copper wiring is formed by coating trenches formed in an insulating film with a barrier metal such as Ta or TaN, then embedding copper, and polishing and removing, by CMP, blanket copper formed on the surface. It is therefore necessary to remove slurry-derived polishing particles, dust produced by polishing, and metal impurities adhering to the surface of the substrate after CMP. However, when the embedded copper wiring is exposed, contact thereof with either an acidic or alkaline chemical liquid can generate wedge-shaped micro corrosion of copper at the interface between the copper and the barrier metal such as Ta or TaN, thus degrading the reliability of a device. Accompanying further miniaturization of the device, during the Cu wiring formation process, such an interface between the copper wiring and the barrier metal might be exposed by the use of a washing liquid, and these corrosion defects become more apparent, thus causing deterioration in the performance and quality of the electrical characteristics. Such corrosion is called a side slit.

It is known that side slits can be caused by an aqueous solution of an organic acid such as oxalic acid, malonic acid, or citric acid, which are conventionally said to be non-corrosive.

Yet another problem relates to corrosion of a wiring material formed from a copper alloy, to which a different type of metal has been added. The copper alloy has local areas where the different type of metal is in contact with the copper, and these areas have the same problem as that of the above-mentioned structure where the barrier metal such as Ta is in contact with copper. That is, if such copper alloy wiring is exposed, even when a conventional aqueous solution of an organic acid is used, contact with the organic acid can easily cause corrosion at the interface between the copper and the different type of metal, and there is a possibility of surface roughness, side slits, and pit-shaped corrosion defects being caused on the copper alloy.

JP, A, 2002-69495 discloses a washing liquid that contains a reducing agent and has a pH of 3 to 12 as a washing liquid that can remove micro particles and metal impurities without corroding a wiring material such as copper or tungsten. However, the higher the pH, the easier it is for side slits to occur and for the reducing agent to decompose. Furthermore, there is a problem that an ammonium compound might cause micro corrosion of copper.

As hereinbefore described, there are various types of washing liquids suitable for conventional wiring materials and interlayer insulating films, but under the current circumstances there is no washing liquid that can simultaneously satisfy the above-mentioned needs of a semiconductor substrate that, for example, has copper wiring exposed and has a structure in which copper is in contact with a different type of metal.

SUMMARY OF THE INVENTION

It is therefore an object of the present invention to provide a washing liquid that has excellent performance in removing micro particles and metal impurities adhering to the surface of a semiconductor substrate after CMP and that does not corrode a metal wiring material. It is another object of the present invention to provide a washing liquid that can remove metal impurities, etc. from the surface of a substrate without causing corrosion and side slits on a Cu surface exposed on the substrate. It is yet another object of the present invention to provide a washing liquid that can remove metal impurities, etc. from the surface of a substrate in which copper is in contact with a barrier metal (for example, Ta/TaN) or in which metal wiring is formed using a copper alloy, without causing surface roughness, side slits, and pit-like corrosion defects of the copper alloy.

As a result of an intensive investigation by the present inventors in order to solve the above-mentioned problems it has been found that a combination of an aqueous solution of an organic acid such as oxalic acid with a specific compound can remove metal impurities, etc. from the surface of a substrate without corroding the surface of metal wiring and, surprisingly, the occurrence of side slits, which are micro corrosion defects of copper caused at the interface between copper and Ta, TaN, etc., can also be suppressed, and the present invention has thus been accomplished.

That is, the present invention relates to a post-CMP washing liquid composition comprising one type or two or more types of aliphatic polycarboxylic acids and one type or two or more types selected from the group consisting of glyoxylic acid, ascorbic acid, glucose, fructose, lactose, and mannose, the washing liquid composition having a pH of less than 3.0.

Furthermore, the present invention relates to the post-CMP washing liquid composition wherein the aliphatic polycarboxylic acid is oxalic acid, malonic acid, malic acid, tartaric acid, or citric acid.

Moreover, the present invention relates to the post-CMP washing liquid composition wherein the amount of glyoxylic acid, ascorbic acid, glucose, fructose, lactose, and mannose used is 0.03 to 5.0 wt %.

Furthermore, the present invention relates to the post-CMP washing liquid composition wherein it further comprises a surfactant.

Moreover, the present invention relates to the post-CMP washing liquid composition wherein it contains no ammonia and no basic organic compound.

Furthermore, the present invention relates to the post-CMP washing liquid composition wherein it is used for a substrate having a structure in which Cu is in contact with a different type of metal, the substrate having Cu wiring after CMP.

Since the post-CMP washing liquid composition of the present invention contains an aliphatic polycarboxylic acid and the above-mentioned specific compound, post-CMP micro particles and metal impurities can be removed without corroding the wiring material. In particular, not only is there no corrosion of the copper wiring, but also there is no corrosion of the copper at the interface between the copper and the layer of barrier metal such as Ta or TaN formed when embedding copper by the damascene process, and thus the occurrence of side slits can be suppressed. Furthermore, it is also possible to remove, from a substrate to which metal wiring has been applied using a copper alloy, post-CMP micro particles and metal impurities without causing surface roughness, side slits, and pit-like corrosion defects of the copper alloy. As a result, an excellent substrate that has unaffected performance in its electrical characteristics can be obtained even when device miniaturization advances.

FIG. 1 shows a comparison between a post-CMP washing liquid composition of the present invention and a conventional washing liquid. Cu wiring is formed by depositing a Cu film on a film of barrier metal formed from Ta or TaN on an insulating film (top diagram) and polishing and removing blanket Cu by CMP. There are residual particles and metal impurities on the substrate surface after the CMP (middle diagram). When washing is carried out using the conventional washing liquid, although the residual particles and the metal impurities are removed by washing, the Cu dissolves along the interface between the wiring copper and the barrier metal, thus forming side slits (bottom left). On the other hand, when washing is carried out using the washing liquid composition of the present invention, the residual particles and the metal impurities can be removed without forming side slits (bottom right).

Furthermore, the washing liquid composition of the present invention can, in particular, improve the wettability of a low permittivity interlayer insulating film when a surfactant is used.

MODES FOR CARRYING OUT THE INVENTION

Figure 1:
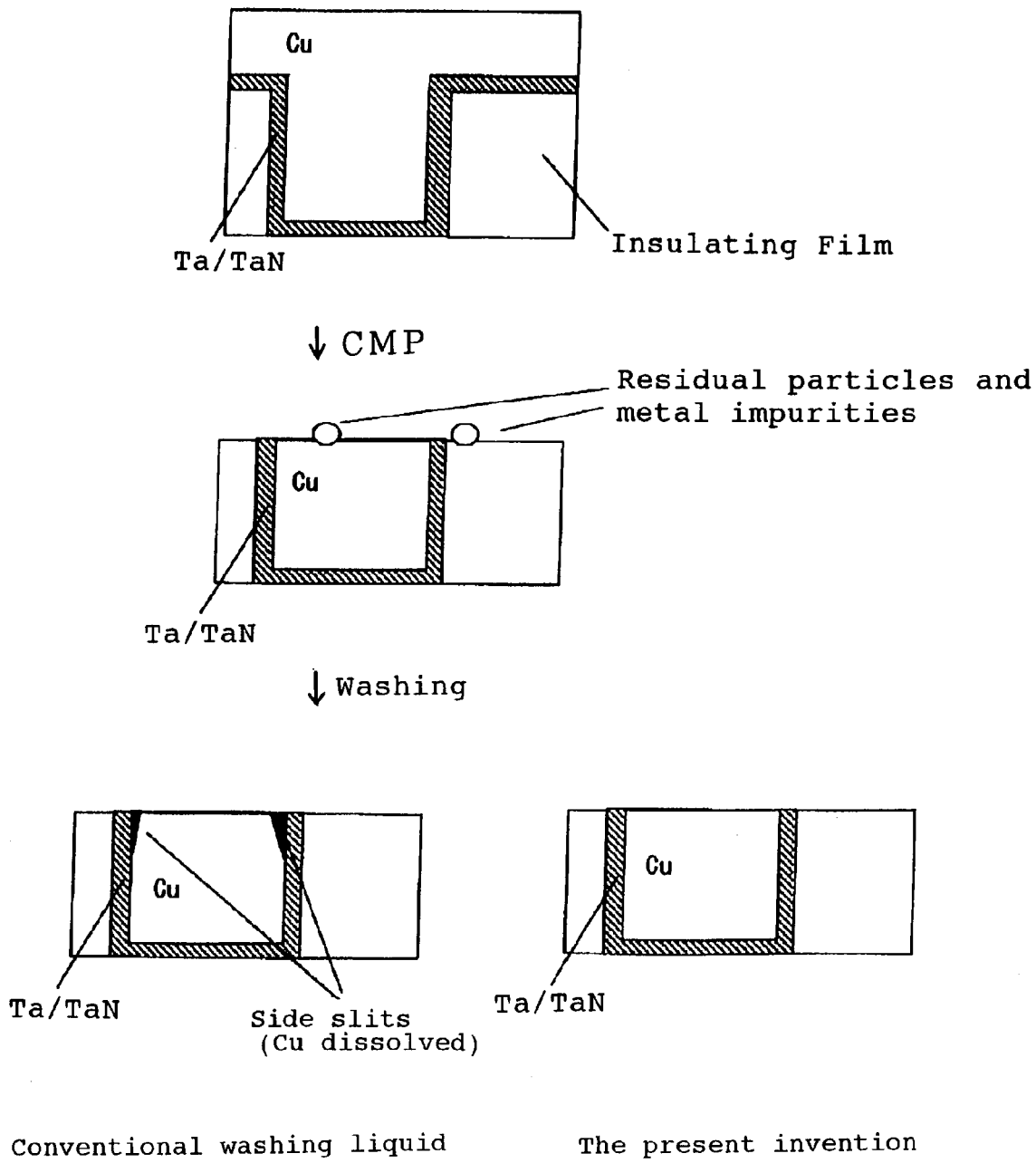
FIG. 1 shows a comparison between a post-CMP washing liquid composition of the present invention and a conventional washing liquid.

The post-CMP washing liquid composition of the present invention includes one type or two or more types of aliphatic polycarboxylic acids and one type or two or more types selected from the group consisting of glyoxylic acid, ascorbic acid, glucose, fructose, lactose, and mannose, and has a pH of less than 3.0. In particular, it can be used suitably for removing micro particles and metal impurities adhering to the surface of a substrate having a structure in which copper is in contact with a different type of metal, for example, a barrier metal such as Ta or TaN, or the surface of a substrate having a copper alloy, to which a different type of metal has been added, the substrates having a wiring material exposed after the CMP process.

Specific examples of the aliphatic polycarboxylic acid used in the washing liquid composition of the present invention include dicarboxylic acids such as oxalic acid and malonic acid and oxypolycarboxylic acids such as tartaric acid, malic acid, and citric acid. In particular, oxalic acid has a high capability in removing metal impurities and is preferably used as the aliphatic polycarboxylic acid in the present invention.

The concentration of the aliphatic polycarboxylic acid in the washing liquid is determined appropriately while taking into consideration, for example, the solubility, a sufficient washing effect, and deposition of crystals, but it is preferably 0.01 to 30 wt %, and more preferably 0.03 to 10 wt %.

With regard to a substance used in the present invention that exhibits an excellent effect in preventing corrosion of metal wiring and, in particular, in preventing the occurrence of side slits in copper, there are glyoxylic acid, ascorbic acid, glucose, fructose, lactose, mannose, etc. They are known as reducing substances and have a ketone group, an aldehyde group, or a double bond in their structures. In order to prevent corrosion of metal wiring, benzotriazole, benzothiazole, etc. are usually used. It is thought that they react with the metal to form an insoluble coating on the surface, thus preventing corrosion. However, a sufficient function is not exhibited with this kind of action in an area where Cu is in contact with a different type of metal such as Ta as in Cu damascene wiring. On the other hand, a compound such as glyoxylic acid, ascorbic acid, glucose, fructose, lactose, or mannose can suppress not only etching of the Cu surface but also side slitting. Although the mechanism thereof is not clear, it is surmised that, since these are reducing compounds, they themselves are oxidized, thus preventing oxidation and corrosion of metal. Although amines such as hydrazine and hydroxylamine are reducing, they tend to accelerate the side slitting, and not all reducing substances can be used in the washing liquid composition of the present invention.

The concentration of glyoxylic acid, ascorbic acid, glucose, fructose, lactose, or mannose is preferably 0.0005 to 10 wt % in order to obtain a sufficient corrosion prevention effect, and more preferably 0.03 to 5 wt %.

The washing liquid of the present invention can contain a surfactant in order to acquire a capability for removing micro particles and compatibility with a water-repellent film such as a Low-K film. For such a purpose it is preferable to use a nonionic or anionic surfactant.

The concentration of the surfactant is preferably 0.0001 to 10 wt % in order to obtain a sufficient effect in removing particles, and more preferably 0.001 to 5 wt %.

The washing liquid of the present invention preferably contains no ammonia and no basic organic compound such as an amine that might cause corrosion, so that no micro corrosion occurs at the interface where copper is in contact with a different type of metal.

The post-CMP washing liquid composition of the present invention is used, in the production of a semiconductor substrate having metal wiring, for removing micro particles and metal impurities adhering to the surface of the substrate after CMP. In particular, this composition can be used suitably for copper and copper alloy wiring, which have poor chemical resistance, since it has excellent impurity removal performance and does not corrode the surface.

EXAMPLES

The present invention is explained in detail below by comparison of Examples of the post-CMP washing liquid composition of the present invention with Comparative Examples, but the present invention is not limited to these examples.

Washing Test

A silicon substrate with an oxide film was immersed in an aqueous solution containing Fe and Cu to forcibly contaminate it (amount of Fe contaminant: $6 \times 10^{13}$ atoms/cm$^2$, amount of Cu contaminant: $6 \times 10^{12}$ atoms/cm$^2$). This was washed with a washing liquid having a composition shown in Table 1 (Comparative Examples 1 to 7, and Examples 1 to 12), rinsed with water and dried. The concentrations of Fe and Cu on the surface were measured using a total reflection X-ray fluorescence system to evaluate the removal performance (Table 2).

Washing conditions: 25° C., 3 min.

Corrosion Test

A silicon wafer subjected to Cu damascene wiring was immersed in a washing liquid shown in Table 1 (Comparative Examples 1 to 7, and Examples 1 to 12) at 25° C. for 10 min, rinsed with running ultrapure water, and dried. The Cu was inspected for corrosion (surface roughness, presence of side slits) by an electron microscope (Table 2).

TABLE 1

| | Washing liquid composition (wt %) | | | | |
|---|---|---|---|---|---|
| | Aliphatic polycarboxylic acid | | Anticorrosive | | Water |
| Comp. Ex. 1 | Oxalic acid | 3.4 | — | | 96.6 |
| Comp. Ex. 2 | Oxalic acid | 0.34 | — | | 99.66 |
| Comp. Ex. 3 | Oxalic acid | 0.06 | — | | 99.94 |
| Comp. Ex. 4 | Oxalic acid | 0.34 | Benzotriazole | 1 | 98.66 |
| Comp. Ex. 5 | Oxalic acid | 0.34 | D-Sorbitol | 5 | 94.66 |
| Comp. Ex. 6 | Oxalic acid | 0.34 | Mercapto-benzothiazole | 1 | 98.66 |
| Comp. Ex. 7 | Malonic acid | 5.0 | — | | 95.0 |
| Example 1 | Oxalic acid | 0.34 | Glyoxylic acid | 0.03 | 99.63 |
| Example 2 | Oxalic acid | 0.34 | Glyoxylic acid | 0.1 | 99.56 |
| Example 3 | Oxalic acid | 0.06 | Glyoxylic acid | 1.0 | 98.94 |
| Example 4 | Oxalic acid | 0.34 | Glyoxylic acid | 0.05 | 99.61 |
| Example 5 | Oxalic acid | 3.4 | Glyoxylic acid | 0.1 | 96.5 |
| Example 6 | Oxalic acid | 0.34 | Ascorbic acid | 0.15 | 99.51 |
| Example 7 | Oxalic acid | 3.4 | Ascorbic acid | 1.0 | 95.6 |
| Example 8 | Oxalic acid | 0.06 | Fructose | 0.05 | 99.89 |
| Example 9 | Oxalic acid | 0.34 | Fructose | 0.5 | 99.16 |
| Example 10 | Oxalic acid | 3.4 | Mannose | 0.3 | 96.3 |
| Example 11 | Oxalic acid | 0.34 | Lactose | 1.0 | 98.66 |
| Example 12 | Malonic acid | 5.0 | Glyoxylic acid | 0.1 | 94.9 |

TABLE 2

| | Evaluation | | | |
|---|---|---|---|---|
| | Fe surface concentration [*1] | Cu surface concentration [*2] | Cu etching [*3] | Side slits [*4] |
| Comp. Ex. 1 | 11.0 | <0.1 | C | C |
| Comp. Ex. 2 | 20.0 | <0.1 | C | C |
| Comp. Ex. 3 | 26.0 | <0.1 | C | C |
| Comp. Ex. 4 | 21.0 | <0.1 | B | C |
| Comp. Ex. 5 | 20.3 | <0.1 | C | C |
| Comp. Ex. 6 | 22.0 | <0.1 | B | C |
| Comp. Ex. 7 | 92.5 | <0.1 | C | C |
| Example 1 | 21.0 | <0.1 | A | A |
| Example 2 | 16.0 | <0.1 | A | A |
| Example 3 | 31.0 | <0.1 | A | A |
| Example 4 | 18.8 | <0.1 | A | A |
| Example 5 | 11.5 | <0.1 | A | A |
| Example 6 | 19.8 | <0.1 | A | A |
| Example 7 | 12.0 | <0.1 | A | A |
| Example 8 | 31.0 | <0.1 | A | A |
| Example 9 | 22.2 | <0.1 | A | A |
| Example 10 | 10.9 | <0.1 | A | A |
| Example 11 | 23.3 | <0.1 | A | A |
| Example 12 | 91.2 | <0.1 | A | A |

[*1] units $\times 10^{10}$ atoms/cm$^2$, amount of contaminant $6 \times 10^{13}$ atoms/cm$^2$
[*2] units $\times 10^{10}$ atoms/cm$^2$, amount of contaminant $6 \times 10^{12}$ atoms/cm$^2$
[*3] Cu surface roughness A: not rough, B: some roughness, C: rough
[*4] Side slits A: none, C: side slits present Glyoxylic acid, ascorbic acid, glucose, fructose, lactose, and mannose can prevent corrosion of the Cu surface and the occurrence of side slits, which are micro corrosion defects, without interfering with the metal removal capability of the aliphatic polycarboxylic acid.

EFFECTS OF THE INVENTION

The post-CMP washing liquid composition of the present invention has excellent properties in removing micro particles and metal impurities adhering to a semiconductor substrate after CMP and in suppressing corrosion of a wiring material. In particular, the above-mentioned effects can be obtained sufficiently even when copper is used as the wiring material, and the occurrence of side slits, which are micro corrosion defects, can be suppressed. Furthermore, for a substrate to which metal wiring has been applied using a copper alloy, the post-CMP washing liquid composition of the present invention has excellent properties in suppressing surface roughness, side slits, and pit-like corrosion defects of the copper alloy. It is therefore possible to obtain an excellent substrate that has unaffected performance in its electrical characteristics even when device miniaturization advances.

What is claimed is:

1. A post-OMP washing liquid composition consisting of one type or two or more types of aliphatic polycarboxylic acids and one type or two or more types selected from the group consisting of glyoxylic acid, ascorbic acid, glucose, fructose, lactose, and mannose, the washing liquid composition having a pH of less than 3.0.

2. The post-CMP washing liquid composition according to claim 1, wherein the aliphatic polycarboxylic acid is oxalic acid, malonic acid, malic acid, tartaric acid, or citric acid.

3. The post-CMP washing liquid composition according to either claim 1 or 2, wherein the amount of glyoxylic acid, ascorbic acid, glucose, fructose, lactose, and mannose used is 0.03 to 5.0 wt %.

4. A post-CMP washing liquid composition consisting of one type or two or more types of aliphatic polycarboxylic acids, one type or two or more types selected from the group consisting of glyoxylic acid, ascorbic acid, glucose, fructose, lactose, and mannose and a surfactant, the washing liquid composition having a pH of less than 3.0.

5. The post-CMP washing liquid composition according to either claim 1 or 2, wherein it is used for a substrate having a structure in which Cu is in contact with a different type of metal, the substrate having Cu wiring after CMP.

* * * * *